United States Patent
Kazemi et al.

(10) Patent No.: US 7,989,842 B2
(45) Date of Patent: Aug. 2, 2011

(54) METHOD AND APPARATUS FOR HETEROJUNCTION BARRIER DIODE DETECTOR FOR ULTRAHIGH SENSITIVITY

(75) Inventors: Hooman Kazemi, Thousand Oaks, CA (US); Chanh Nguyen, Calabasas, CA (US); Berinder Brar, Newbury Park, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 281 days.

(21) Appl. No.: 12/395,528

(22) Filed: Feb. 27, 2009

(65) Prior Publication Data

US 2010/0219449 A1    Sep. 2, 2010

(51) Int. Cl.
*H01L 31/0352* (2006.01)
*H01L 29/205* (2006.01)
*H01L 21/329* (2006.01)

(52) U.S. Cl. ... 257/184; 257/201; 257/21; 257/E29.091; 257/E21.359; 257/E31.033; 438/571

(58) Field of Classification Search .................. 257/184
See application file for complete search history.

(56) References Cited

U.S. PATENT DOCUMENTS

| | | | |
|---|---|---|---|
| 5,412,224 A | 5/1995 | Goronkin et al. | |
| 5,430,310 A | 7/1995 | Shibasaki et al. | |
| 5,739,559 A | 4/1998 | Kagaya et al. | |
| 6,215,136 B1 | 4/2001 | Tserng et al. | |
| 6,420,728 B1 * | 7/2002 | Razeghi | 257/14 |
| 2002/0000564 A1 * | 1/2002 | Schmitz et al. | 257/109 |
| 2002/0131462 A1 | 9/2002 | Lin et al. | |
| 2003/0015767 A1 | 1/2003 | Emrick et al. | |
| 2006/0035467 A1 | 2/2006 | Nam et al. | |
| 2006/0135110 A1 * | 6/2006 | Przybysz et al. | 455/331 |
| 2006/0215718 A1 | 9/2006 | Yasuda et al. | |
| 2006/0246700 A1 | 11/2006 | Johnson | |

OTHER PUBLICATIONS

M. H. Yang, K. B. K. Teo, and W. I. Milne, Carbon nanotube Schottky diode and directionally dependent field-effect transistor using asymmetrical contacts, Dec. 2005, Applied Physics Letters 87, 253116.*
Zimmerman, J.D. et al.; "ErAs Island-Stacking Growth Technique for Engineering Textured Schottky Interfaces"; J. Vac. Sci. Technol. B 24(3); pp. 1483-1487; May/Jun. 2006.
Kazemi, H. et al.; "First THz and IR Characterization of Nanometer-Scaled Antenna-Coupled InGaAs/InP Schottky-Diode Detectors for Room Temperature Infrared Imaging"; Proc. of SPIE; vol. 6542; 4 pages.
Kazemi, H. et al.; "First MMW Characterization of ErAs/InAlGaAs/InP Semimetal-Semiconductor-Shottky Diode ($S^3$) Detectors for Passive Millimeter-Wave and Infrared Imaging"; Proc. of SPIE; vol. 5789; pp. 80-83.

* cited by examiner

*Primary Examiner* — Jarrett Stark
*Assistant Examiner* — Lawrence Tynes, Jr.
(74) *Attorney, Agent, or Firm* — Snell & Wilmer L.L.P.

(57) ABSTRACT

The disclosure relates to a zero-bias heterojunction diode detector with varying impedance. The detector includes a substrate supporting a Schottky structure and an Ohmic contact layer. A metallic contact layer is formed over the Ohmic layer. The Schottky structure comprises a plurality of barrier layers and each of the plurality of barriers layers includes a first material and a second material. In one embodiment, the composition percentage of the second material in each of the barrier layers increases among the plurality of barrier layers from the substrate to the metal layer in order to provide a graded periodicity for the Schottky structure.

22 Claims, 4 Drawing Sheets

METHOD AND APPARATUS FOR HETEROJUNCTION BARRIER DIODE DETECTOR FOR ULTRAHIGH SENSITIVITY

STATEMENT REGARDING GOVERNMENT RIGHTS

This invention was made with Government support under contract W911 QX-04-C-0125 awarded to Rockwell Scientific Company, LLC (now known as Teledyne Scientific & Imaging, LLC) by the U.S. Army Research Development and Engineering Command (RDECOM) Army Research Laboratory (ARL) on behalf of the Defense Advanced Research Projects Agency (DARPA) Microsystems Technology Office (MTO) and the DARPA MTO Microantenna Arrays: Technology and Applications (MIATA) Program. The Government has certain rights in this invention.

BACKGROUND

1. Field

The disclosure relates to a method and apparatus for a heterojunction barrier diode ("HBD"). More specifically, the disclosure relates to a highly sensitive diode detector having a heterojunction barrier layer providing detection sensitivity of about 20,000 V/W or more while having low capacitance.

2. Description of the Related Art

A focal-plane array ("FPA") is an image sensing device consisting of an array (typically rectangular) of light-sensing pixels at the focal plane of a lens. Conventional FPAs are used for imaging purposes such as photography or videography. More advanced FPAs are used for non-visual imaging purposes such as spectroscopy, light detection, and wave-front sensing. While FPAs cover a variety of imaging devices, its most common usage is for two-dimensional imaging devices that are sensitive in the infrared ("IR") spectrum. Devices which are sensitive in other spectra are conventionally referred to by other terms, such as Charge-Coupled Device ("CCD") and CMOS image sensor in the visible spectrum.

FPAs operate by detecting photons and generating an electrical charge, voltage or resistance in proportion to the number of photons detected. The charge relates to the photons received at each pixel. The charge, voltage or resistance is then measured, digitized, and used to construct an image of the object, scene, or the phenomenon that emitted the photons.

In the millimeter wave and terahertz regions, FPA detectors are complex and expensive. This is largely due to the sensitivity required for extracting the minimal passive radiation which is available in the millimeter wave and terahertz regions. Passive radiation is not available in IR and hence is not a factor in the FPA design. Such complexity renders the FPAs operating in the terahertz range expensive, complex and fragile. A direct detector substantially reduces the required complexity. However, the direct detectors do not have the sensitivity required for imaging applications. Therefore, there is a need for a detector having ultrahigh sensitivity.

SUMMARY

In one embodiment, the disclosure relates to a zero-bias heterojunction diode detector with varying impedance. The detector comprises a substrate supporting a Schottky structure and an Ohmic contact layer. A metallic contact layer is formed over the Ohmic contact layer. The Schottky structure comprises a plurality of barrier layers and each of the plurality of barriers layers includes a first material and a second material. In one embodiment, the composition percentage of the second material in each of the barrier layers increases among the plurality of barrier layers from the substrate to the metal layer in order to provide a graded periodicity for the Schottky structure.

In another embodiment, the disclosure relates to a method for forming a semiconductor detection device by forming a Schottky structure over a substrate. The Schottky structure can have a plurality of successive barrier layers with each barrier layers having a first material and a second material. An ohmic contact layer can be formed over the Schottky structure and a top metal layer can be formed over the Ohmic contact layer. The combination of the Ohmic contact layer and the metal layer can address mechanical and structural informalities of the Schottky structure to thereby provide production uniformity.

In one embodiment, the quantity of the second material in each of the successive barrier layers increase to provide a graded conduction band for the Schottky structure.

In still another embodiment, the disclosure relates to a method for a detection device having collection optics for receiving a plurality of photons from a source. A detector receives the collected photons from the collection optics and forms a first signal representing the received plurality of photons. The detector can have a substrate, an anode contact and a Schottky structure. The detector communicates the first signal to an amplifier which then amplifies the first signal. An integrator receives the amplified signal and forms an output signal defining the MMW signal. In a preferred embodiment, the Schottky structure includes a plurality of first and second barrier layers in which the thickness of the first barrier layer increases successively with respect to the second barrier layer.

BRIEF DESCRIPTION OF THE DRAWINGS

These and other embodiments of the disclosure will be discussed with reference to the following exemplary and non-limiting illustrations, in which like elements are numbered similarly, and where.

DETAILED DESCRIPTION

The disclosure relates to a zero-bias detector with ultrahigh sensitivity to millimeter and terahertz wave radiation. Ultrahigh sensitivity can include sensitivity of about 20,000 V/W or higher. The disclosed embodiments also provide an improved device architecture which provides ease and consistency in fabrication.

All objects whose temperature is above absolute zero (0° K.) emit a passive radiation known as millimeter-wave (MMW) radiation. MMW radiation is more detectable than infrared radiation in poor ambient environment or where ambiance interference is great. The radiation emitted in the MMW range can be as much as $10^8$ times smaller than the radiation emitted in the infrared range. However, the conventional MMW receivers have at least $10^5$ times better noise performance than conventional infrared detectors. The temperature contrast recovers the balance. Consequently, the conventional MMW imaging is at least comparable to the infrared systems. The MMW imaging sensors are utilized extensively, among others, in detecting concealed weapons, medical imaging and landing an airplane in poor weather.

Figure 1:
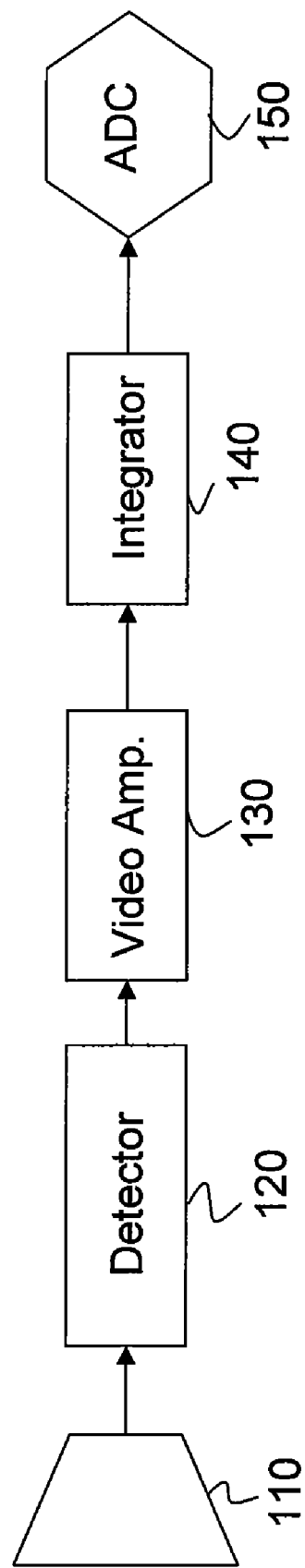
FIG. 1 illustrates a direct detection system using a detector according to an embodiment of the disclosure.

FIG. 1 illustrates a direct detection system using a detector according to an embodiment of the disclosure. In FIG. 1, collection optics 110 receives photons from an object under study and directs a representative signal to detector 120. Detector 120 can be a diode detector for receiving a quantity of photons and transmitting a voltage signal responsive to the incoming photons. Video amplifier 130 receives and amplifies the voltage signal from detector 120. The amplified video signal is then directed to integrator 140. Integrator 140 cumulatively adds the video signal to the previously-received signals to form an image signal. The image signal is then directed to analog-to-digital ("ADC") converter 150 where the received voltage signal is converted to a digital signal for further processing or display. To improve detection, detector 120 is configured as a zero-bias detector with ultra-high sensitivity (i.e., sensitivity of 20,000 V/W or higher).

Figure 2:
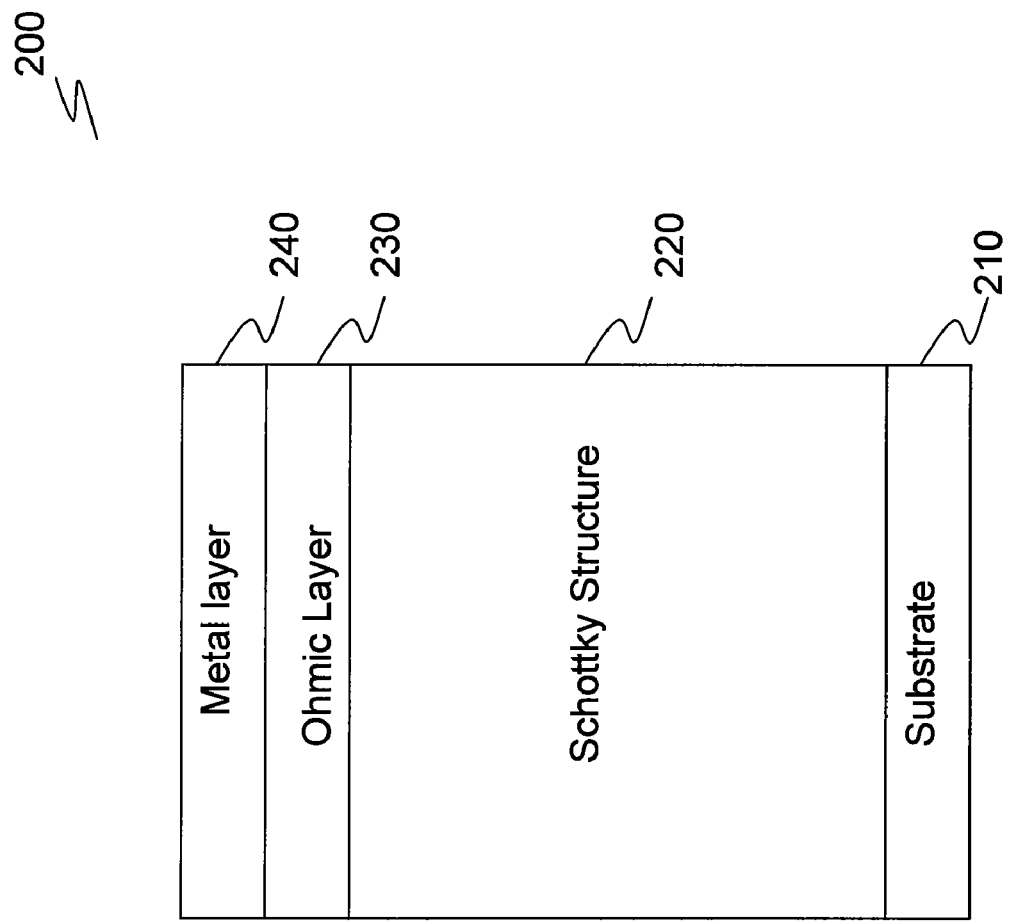
FIG. 2 illustrates an MMW detector according to an embodiment of the disclosure.

FIG. 2 illustrates an MMW detector according to an embodiment of the disclosure. Detector 200 of FIG. 2 includes substrate 210, Schottky structure 220, Ohmic contact layer 230 and contact or metal layer 240. Substrate 210 can comprise any conventional material, for example, Indium Phosphate (InP) or Indium Germanium (InG).

In one embodiment, Schottky structure 220 includes a plurality of barrier layers. Each barrier layer can have a plurality of sublayers. In one embodiment, a barrier layer comprises a first sublayer and a second sublayer, wherein the first sublayer comprises a first material and the second sublayer comprises a second material. In another embodiment, the first material comprises Indium Gallium Arsenide (InGaAs) and the second material comprises Indium Aluminum Arsenide (InAlAs). Because InGaAs and InAlAs have different conduction band gaps, different barrier layers having different portions of each sublayer can have a broad range of conduction bandgap. Thus, a Schottky structure can be designed in which the bandgap energy increase or decreases among the plurality of barrier layers. In one embodiment, at least one of the InAlAs and InGaAs is lightly doped or entirely undoped.

The first sublayer and the second sublayer form a barrier layer. A plurality of barrier layers form the Schottky structure of the detector diode. The barrier layer can have a thickness of about 0.5-6 μm. In one embodiment, the barrier layer has a thickness of about 1-2 μm. The thickness of barrier layers need not be uniform and can change throughout the Schottky structure. For example, the barrier layer adjacent substrate 210 can have a thickness of about 1 μm and the thickness of the subsequent barrier layers can be incrementally increased such that the barrier layer adjacent ohmic contact layer 230 can have a thickness of about 2.5 μm. The thickness of each sublayer in a barrier layer need not be uniform.

Ohmic layer 230 can define a metal layer. Ohmic layer 230 contacts metal layer 240. Accordingly, it is important to devise ohmic layer 230 to have low impedance. An exemplary contact layer 230 can have Indium Gallium Arsenide (InGaAs). The InGaAs can be doped or undoped. In another embodiment, ohmic layer 230 can be a rectifying semiconductor layer. Ohmic layer 230 may be used optionally and detectors can be devised consistent with the principles disclosed herein without ohmic layer 230.

Contact layer 240 is formed over the ohmic layer 230. Contact layer 240 can comprise an Indium Phosphate (InP) layer or an Indium Gallium Arsenide (InGaAs) layer or a combination of InP and InGaAs. Contact layer 240 can have a thickness of a few microns, for example 1-2 μm. In one embodiment, contact layer 230 is an n-type doped layer. In another embodiment, ohmic layer 230 has substantially the same composition as substrate 210 and contact layer 240 has a more conductive composition than the ohmic layer 230 or substrate 210.

Figure 3:
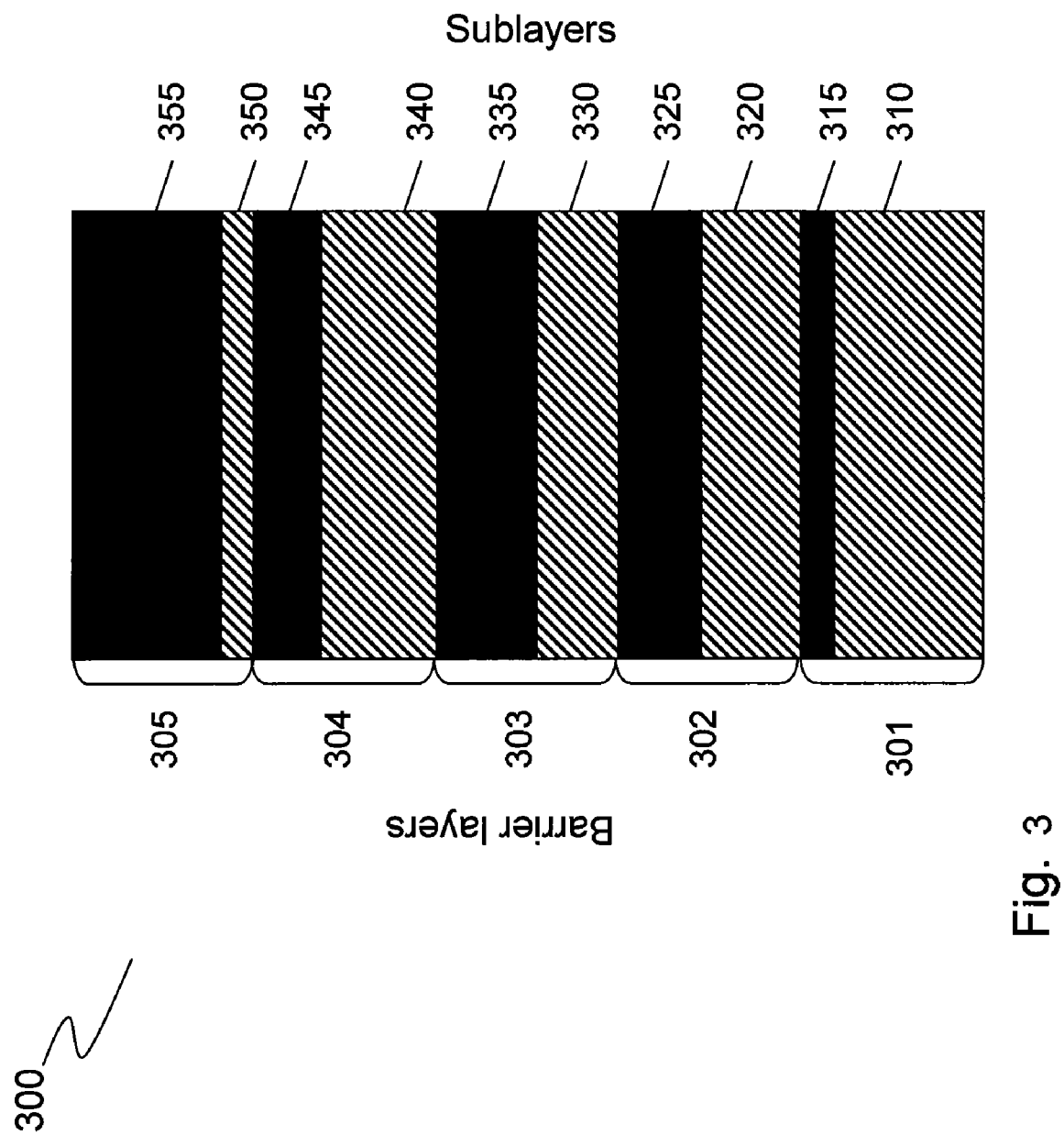
FIG. 3 schematically illustrates a Schottky structure according to an embodiment of the disclosure.

Schottky structure 220 can comprise a plurality of barrier layers. FIG. 3 schematically illustrates a Schottky structure according to an embodiment of the disclosure. Specifically, FIG. 3 shows Schottky structure 300 with five barrier layers: 301, 302, 303, 304 and 305. The first barrier layer 301 includes sublayers 310 and 315, the second barrier layer 302 includes sublayers 320 and 325, the third barrier layer 303 includes sublayers 330 and 335, the fourth barrier layer 304 includes sublayers 340 and 345 and the fifth barrier layer 305 includes sublayers 350 and 355. Each of the first sublayers 310, 320, 330, 340 and 350 can substantially comprise of a first material. Each of the second sublayers 315, 325, 335, 345 and 355 can substantially comprise of a second material.

It should be noted that while the barrier layers of FIG. 3 include two sublayers, a Schottky structure can be devised in which each barrier layer is an alloy-type mixture of a first material and a second material. Thus, while the thickness of the barrier layers remains substantially constant throughout the Schottky structure, the percentage of a material in the Schottky structure increases/decreases throughout the Schottky structure.

The thickness of each barrier layer defines the periodicity for the barrier layer. It is evident from FIG. 3 that while the periodicity of the barrier layers remains constant, the duty cycle defined by a ratio of the thickness of the first and the second sublayers of a barrier layer changes. The duty cycle is directly related to the conduction band edge for each barrier layer. Thus, changing the duty cycle of a barrier layer changes (i.e., increases or decreases) its conduction band. In an embodiment, the bandgap energy of the Schottky structure 300 can be designed to steadily increase among barrier layers 301, 302, 303, 304 and 305. For example, altering the thickness of layers 310, 320, 330, 340 and 350 as compared to layers 315, 325, 335, 345 and 355 can provide a Schottky structure with a graded conduction band edge. Because the turn-on voltage of the diode is determined as a function of its material composition, detector 300 can be configured to provide a desired turn-on voltage.

Figure 4:
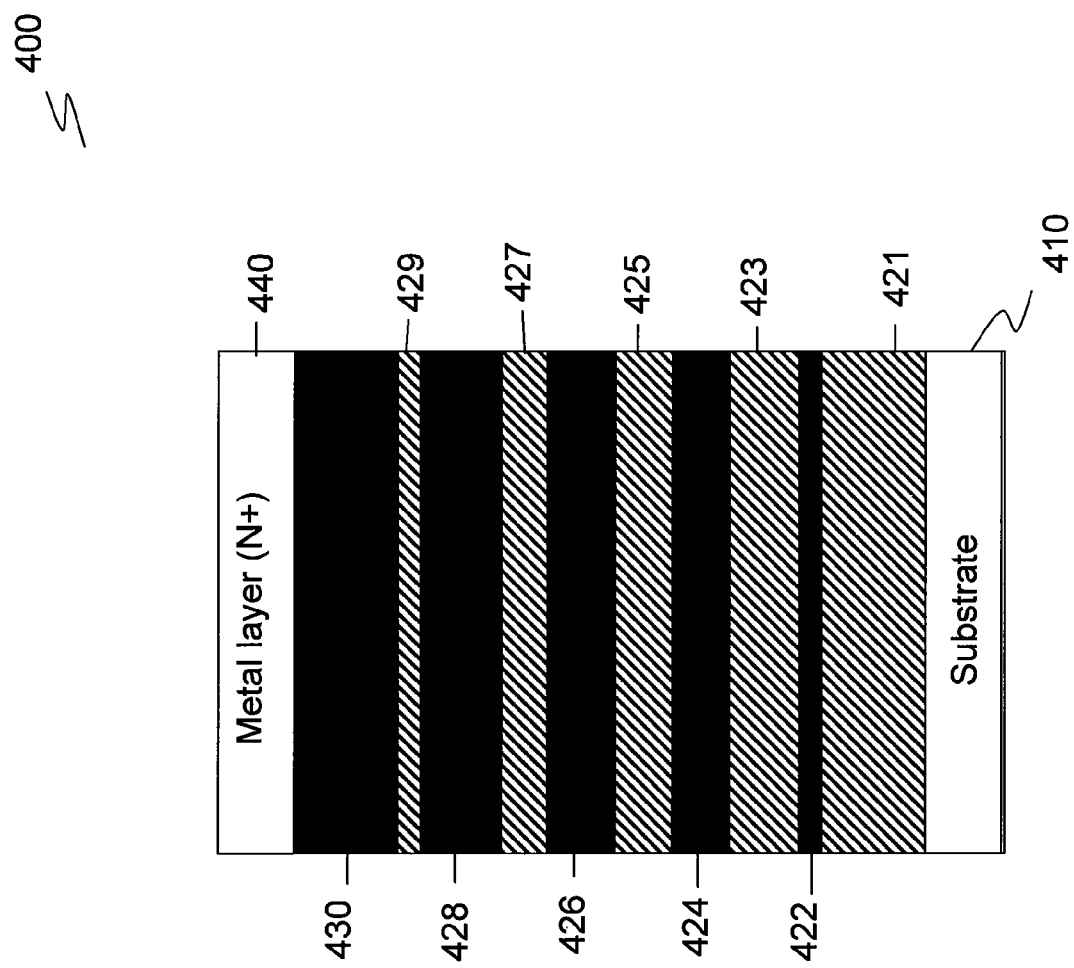
FIG. 4 is a schematic representation of another embodiment of the disclosure.

FIG. 4 is a schematic representation of another embodiment of the disclosure. Substrate 410 of FIG. 4 supports a Schottky structure having first sublayers 421, 423, 425, 427, and 429 and second sublayers 422, 424, 426, 428, and 430. In FIG. 4, metal layer 440 makes direct contact with second sublayer 430. Metal layer 440 is doped as $N^+$ layer and can define the anode pole of the diode detector 400.

In an embodiment, where the Schottky structure is not doped, metal layer 440 provides an additional benefit in that it covers the second sublayer 430. Consequently, a physical infirmity of the sublayer 430 is covered by metal layer 440. Further, the physical disparity of metal layer 440 can be oxidized and etched away during the fabrication process, thus rendering a reproducible structure with little variation between samples. Finally, because metal contact layer 440 forms an ohmic contact as compared to a Schottky contact, the resulting conduction is a uniform performance with less sensitivity to the fabrication process.

While the principles of the disclosure have been illustrated in relation to the exemplary embodiments shown herein, the principles of the disclosure are not limited thereto and include any modification, variation or permutation thereof.

What is claimed is:

1. A semiconductor device comprising:
a substrate;
a Schottky structure formed on the substrate and having a proximal barrier layer and a distal barrier layer, the proximal barrier layer positioned closer to the substrate than the distal barrier layer, each of the proximal barrier layer and the distal barrier layer including a first sublayer with a first material and a second sublayer with a second material, each of the first sublayers positioned closer to the substrate than the corresponding second sublayer, the second sublayer of the distal barrier layer having a thickness greater than a thickness of the second sublayer of the proximal barrier layer;
an ohmic contact layer formed on the Schottky structure; and
a metal layer formed on the ohmic contact layer.

2. The semiconductor device of claim 1, wherein the substrate comprises InP.

3. The semiconductor device of claim 1, wherein the Schottky structure has a conductance defined by one of thickness or composition of the second material in each of the plurality of barrier layers.

4. The semiconductor device of claim 1, wherein the metal layer is $N^+$ doped.

5. The semiconductor device of claim 1, wherein the first material comprises InGaAs and the second material comprises InAlAs.

6. The semiconductor device of claim 1, wherein the proximal barrier layer and the distal barrier layer have substantially identical thicknesses.

7. The semiconductor device of claim 1, wherein the semiconductor device defines a diode detector.

8. The semiconductor device of claim 1, wherein the semiconductor device provides sensitivity of about 20,000 V/W or greater.

9. The semiconductor device of claim 1, wherein the first material and the second material are stacked to form one of the proximal barrier layer and the distal barrier layer, and each of the proximal barrier layer and the distal barrier layer has a thickness of about 1-2 μm.

10. The semiconductor device of claim 1, wherein the first material and the second material have different conduction band energy.

11. The semiconductor device of claim 1, wherein the ohmic layer is characterized as having a linear and symmetric current/voltage relationship.

12. The semiconductor device of claim 1, wherein the Schottky structure defines a rectifier.

13. The semiconductor device of claim 1, wherein the second material and the substrate have substantially identical compositions.

14. A method for forming a semiconductor device, the method comprising:
forming a Schottky structure on a substrate, the Schottky structure including a proximal barrier layer, an intermediate barrier layer, and a distal barrier layer, the proximal barrier layer positioned closer to the substrate than the distal barrier layer, the intermediate barrier layer positioned between the proximal barrier layer and the distal barrier layer, each of the proximal, intermediate, and distal barrier layers having a first sublayer and a second sublayer, each of the first sublayers positioned closer to the substrate than the corresponding second sublayer, the second sublayer of the intermediate barrier layer having a thickness greater than a thickness of the second sublayer of the proximal barrier layer, the second sublayer of the distal barrier layer having a thickness greater than the thickness of the second sublayer of the intermediate barrier layer;
forming an ohmic layer over the Schottky structure; and
forming a metal layer over the ohmic layer.

15. The method of claim 14, wherein the substrate comprises InP.

16. The method of claim 14, wherein the metal layer is $N^+$ doped.

17. The method of claim 14, wherein each of the first sublayers comprises InGaAs and each of the second sublayers comprises InAlAs.

18. The method of claim 14, wherein each of the proximal barrier layer, intermediate barrier layer, and distal barrier layer has a substantially identical thickness.

19. The method of claim 14, wherein each of the first sublayers has a higher conduction band energy than the corresponding second sublayer.

20. A MMW detection device comprising:
a collection optics for receiving a plurality of photons from a source;
a detector for receiving the plurality of photons from the collection optics and forming a first signal representing the plurality of photons received from the source, the detector having a Schottky structure including a proximal barrier layer and a distal barrier layer, the proximal barrier layer positioned closer to the substrate than the distal barrier layer, each of the proximal barrier layer and the distal barrier layer including a first sublayer and a second sublayer, each of the first sublayers positioned closer to the substrate than the corresponding second sublayer, the first sublayer of the proximal barrier layer having a thickness greater than a thickness of the first sublayer of the distal barrier layer;
an amplifier for receiving the first signal from the detector and providing an amplified signal; and
an integrator for receiving the amplified signal and forming an output signal defining a MMW signal intensity.

21. The MMW detection device of claim 20, wherein each of the first layers includes a first material comprises InGaAs and each of the second layers includes a second material comprises InAlAs.

22. The MMW detection device of claim 20, wherein each of the proximal barrier layer and distal barrier layer has substantially an identical thickness.

* * * * *